United States Patent [19]

Botts

[11] Patent Number: 4,717,830
[45] Date of Patent: Jan. 5, 1988

[54] CORRELATED SAMPLING AMPLIFIER

[75] Inventor: Steven E. Botts, Santa Barbara, Calif.

[73] Assignee: Santa Barbara Research Center, Goleta, Calif.

[21] Appl. No.: 886,708

[22] Filed: Jul. 18, 1986

[51] Int. Cl.$^4$ ............................................. H04N 3/14
[52] U.S. Cl. ................................ 250/578; 358/213.16
[58] Field of Search .......................... 250/211 J, 578; 357/30 R, 31,32; 358/212, 213.15, 213.16

[56] References Cited

U.S. PATENT DOCUMENTS

| | | | |
|---|---|---|---|
| 4,435,730 | 3/1984 | Bendell et al. | 358/213.15 |
| 4,635,126 | 1/1987 | Kinoshita | 358/213.16 |
| 4,651,015 | 3/1987 | Nishizawa et al. | 250/211 J |

Primary Examiner—David C. Nelms
Assistant Examiner—Stephone B. Allen
Attorney, Agent, or Firm—Ronald L. Taylor; A. W. Karambelas

[57] ABSTRACT

An infrared imaging system includes a scanner of infrared radiation emanating from a subject, the radiation being scanned past an array of radiation detectors disposed on a common substrate. A set of amplifiers connecting with a multiplexer is built upon the array of detectors, individual ones of the amplifiers connecting with respective ones of the detectors. Each amplifier is composed of a structure having the components of a charge-coupled device and includes circuitry for pulsing a charge-coupled device repetitively. A transistor switching circuit interconnects a detector with its corresponding charge-coupled device for modulating the magnitude of charge in each charge packet propagating through the device. A pair of integrators is disposed on the common substrate, and a steering circuit steers modulated and unmodulated pulses to alternate ones of the integrators. A subtraction circuit forms the difference of output integrated signals from the integrators to produce amplified detected signals which are substantially free of drift associated with semiconductor material used in fabricating the detectors and the charge-coupled devices. Samples of the detected signals provide pixels in an image of the subject.

12 Claims, 4 Drawing Figures

CORRELATED SAMPLING AMPLIFIER

BACKGROUND OF THE INVENTION

This invention relates to an amplifier suitable for amplification of infrared signals detected by photovoltaic detectors and, more particularly, to a construction of amplifier employing a charge-coupled device with high-speed alternate sampling of a detector signal and a detector noise level. Noise is correlated in the resulting sample sequences. An output signal is obtained as the difference of integrals of both of the sequences.

There is considerable interest in the construction of infrared scanning systems to provide images of infrared subject matter. Typically, such systems employ an array of photovoltaic detectors which is scanned across subject matter to develop a set of swaths from which an image of the subject is obtained. In order to reduce the size of the imaging system, it is convenient to construct the array of detectors from semiconductor material disposed on a common substrate. In addition, to minimize the use of numerous wires for connection with individual ones of the detectors, it is preferable to build a multiplexer on top of the detector array whereby individual ones of the detector signals can be sampled and sequentially switched via the multiplexer for communication via a common link to a utilization device. The utilization device would include a demultiplexer, filters, and other well-known circuits for combining the detector signals to display an image of the subject.

A set of preamplifiers is connected between respective ones of the detectors and the multiplexer. Preferably, the amplifiers would be constructed on top of the array of detectors alongside the multiplexer, thereby to reduce the overall size of the detector assembly.

A problem arises in that the amplifiers must be capable of amplifying the individual detector signals without the introduction of excessive noise, thereby to enable the presentation of a clear image of the subject. In the detection of infrared radiation having a wavelength of 12 microns, it is advantageous to employ a detector composed of mercury, cadmium, and tellurium.

One solution to the problem of noise reduction is the use of low temperature operation in which a plane of the detectors, often referred to as the focal plane, is cooled to a temperature of approximately 851 Kelvin. Clearly, the introduction of such cooling greatly increases the complexity of the scanning system. In addition, the cooling introduces electrical effects such as an increase in the impedance of the detectors. In the case of the foregoing mercury-cadmium-tellurium photovoltaic detectors, the noise is characterized as a drift in the magnitude of the quiescent current of the detectors. Such drift derogates from the operation of the scanning system, but can be significantly reduced by a lowering of the temperature of the focal plane. However, as noted above, such low temperature operation is disadvantageous because of the excess complexity associated with cooling equipment.

SUMMARY OF THE INVENTION

The foregoing problem is overcome and other advantages are provided by the use of an amplifier incorporating the invention, which amplifier compensates for the effects of detector noise, particularly the foregoing drift, so as to enable the utilization of the detectors at temperatures substantially higher than the foregoing 851 K. In particular, the use of the amplifier of the invention provides for a scanning system which is suitable both mechanically and electrically for use in satellite observation of the earth.

In accordance with the invention, the amplifier is constructed as a charge coupled device (CCD), and further comprises control electrodes applied to individual cells of the CCD and a switching circuit for alternately coupling and decoupling signals from a photovoltaic detector to the control terminals of the CCD. A pulsing circuit initiates a sequence of charge pulses which propagates along the CCD. By virtue of the foregoing action of the switching circuit, alternate ones of the charge pulses have a magnitude dependent on detector drift, while the remaining pulses have a magnitude dependent on the sum of the drift plus an increment dependent on the detected signal strength from the infrared subject.

Thereby, two interleaved sequences of pulses of charge propagate along the CCD. The rate of pulsing is at least double the Nyquist sampling rate of signals to be imaged, more than four times the base bandwidth of pixel signals which are to be imaged. This relationship of the sampling frequency insures correlation between successive charge pulses so that the pulses in each of the sequence can be combined for a reduction in the amount of noise and an increase in the signal strength.

The invention further comprises a pair of integrators coupled to the CCD, the coupling being implemented by a pair of gate electrodes which are driven alternately, and in synchronism with the pulsing of the CCD, so as to apply one charge sequence to one integrator and the second charge sequence to the second integrator. Each integrator integrates its sequence of charge pulses over an interval of time equal to the duration of one pixel signal. A subtraction circuit connects with the integrators and forms the difference between integration signals of the two integrators. This difference is the output signal of the amplifier, and is a substantially noise-free replica of the infrared signal detected by the photovoltaic detector.

BRIEF DESCRIPTION OF THE DRAWING

The foregoing aspects and other features of the invention are explained in the following description, taken in connection with the accompanying drawing, wherein.

DETAILED DESCRIPTION

Figure 1:
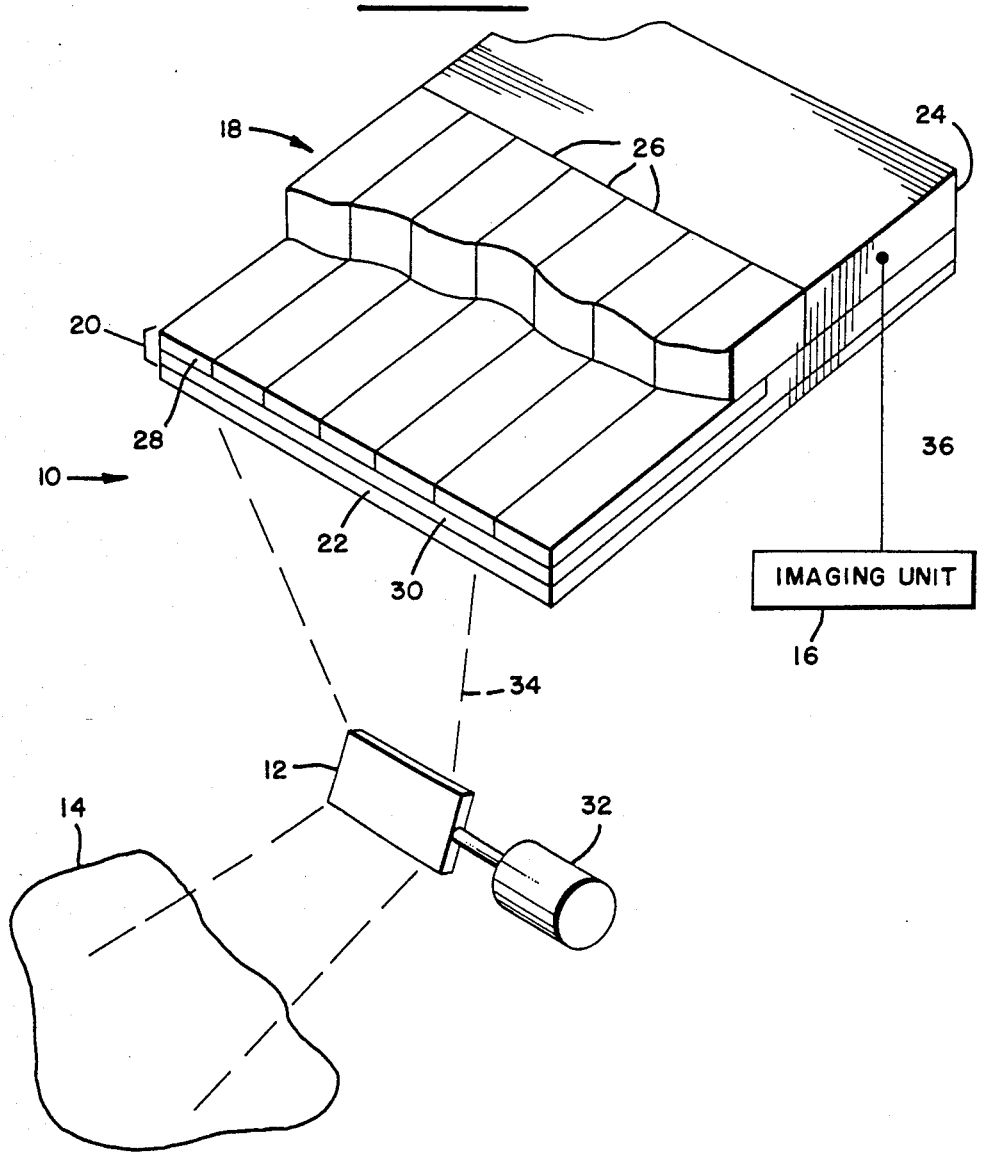
FIG. 1 is a stylized view of a detector array having a monolithic semiconductor structure supporting a multiplexer and a set of amplifiers embodying the invention in an infrared scanning system.

FIG. 1 shows an infrared scanning system 10 employing a scanning mirror 12 for forming an image of a subject 14 in an imaging unit 16. The system 10 further comprises a monolithic semiconductor structure 18 which includes an array of photovoltaic detectors 20 disposed on a common substrate 22, the structure 18 also including a multiplexer 24, and a set of amplifiers 26 disposed in registration with respective ones of the detectors 20. Each of the detectors 20 is constructed as a diode having a capping layer 28 and a base layer 30 which supports the capping layer 28. A motorized drive 32 pivots the mirror 12 repetitively to provide a periodic scanning of infrared rays 34 of radiation from the subject 14 to the array of detectors 20.

The substrate 22 is composed of a cadmium telluride semiconductor material which is transparent to infrared radiation having a wavelength of 12 microns. Luminous flux, represented by the rays 34, propagates through the substrate 22 to impinge upon the base layer 30 in each of the detectors 20. The base layer 30 is common to all of the detectors 20, and is composed of a mercury-cadmium-telluride semiconductor material which absorbs microwave radiation having a wavelength of 12 microns. The capping layer 28 in each of the detectors 20 is also formed of a mercury-cadmium-telluride semiconductor material. The semiconductor materials are doped; for example, the capping layer 28 may have type N doping, the base layer 30 may have a type P doping, and the substrate 22 may have a type N doping. The overall configuration of the array of detectors 20 is that of a chip which may be, by way of example, 4 mils by 4 mils in size, and may be formed with as many as 100 detectors, of which only a few are shown in FIG. 1 to simplify the presentation. Typically, one multiplexer 24 is employed for each group of twenty detectors. Each of the multiplexers 24 connects via a line 36 to the imaging unit 16.

The detectors 20 are arranged in a linear array, and scan the subject 14 in a direction perpendicular to the array. Upon a pivoting of the mirror 12, each of the detectors 20 provides a separate line scan of subject matter for the imaging unit 16, the line scans of the array of detectors 20 being contiguous to provide imaging data of a region of the subject 14. The infrared signals detected by each of the detectors 20 during a scanning are amplified by a corresponding one of the amplifiers 26 and coupled via the multiplexer 24 to the imaging unit 16. The data provided by each detector is dependent on the bandwidth of the communication channel coupled to each detector 20, the communication channel including circuitry within the amplifiers 26 and the imaging unit 16 as will be described with reference to FIG. 3. As shown in FIG. 1, the capping layer 28 extends only partway along the under surface of an amplifier 26, the base layer 30 contacting the balance of each amplifier 26. Thereby, electrical connection can be made between an amplifier 26 and both terminals, namely the layers 28 and 30, of a detector 20.

Figure 2:
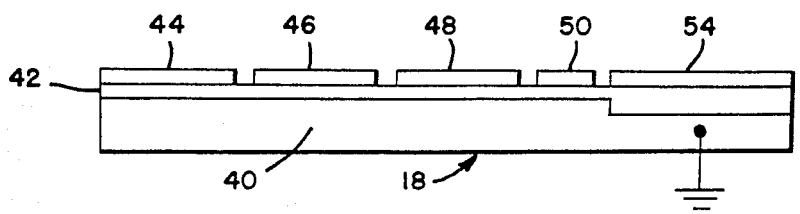
FIG. 2 is a side elevation view of a charge-coupled device which forms a part of an amplifier of FIG. 1.
Figure 3:
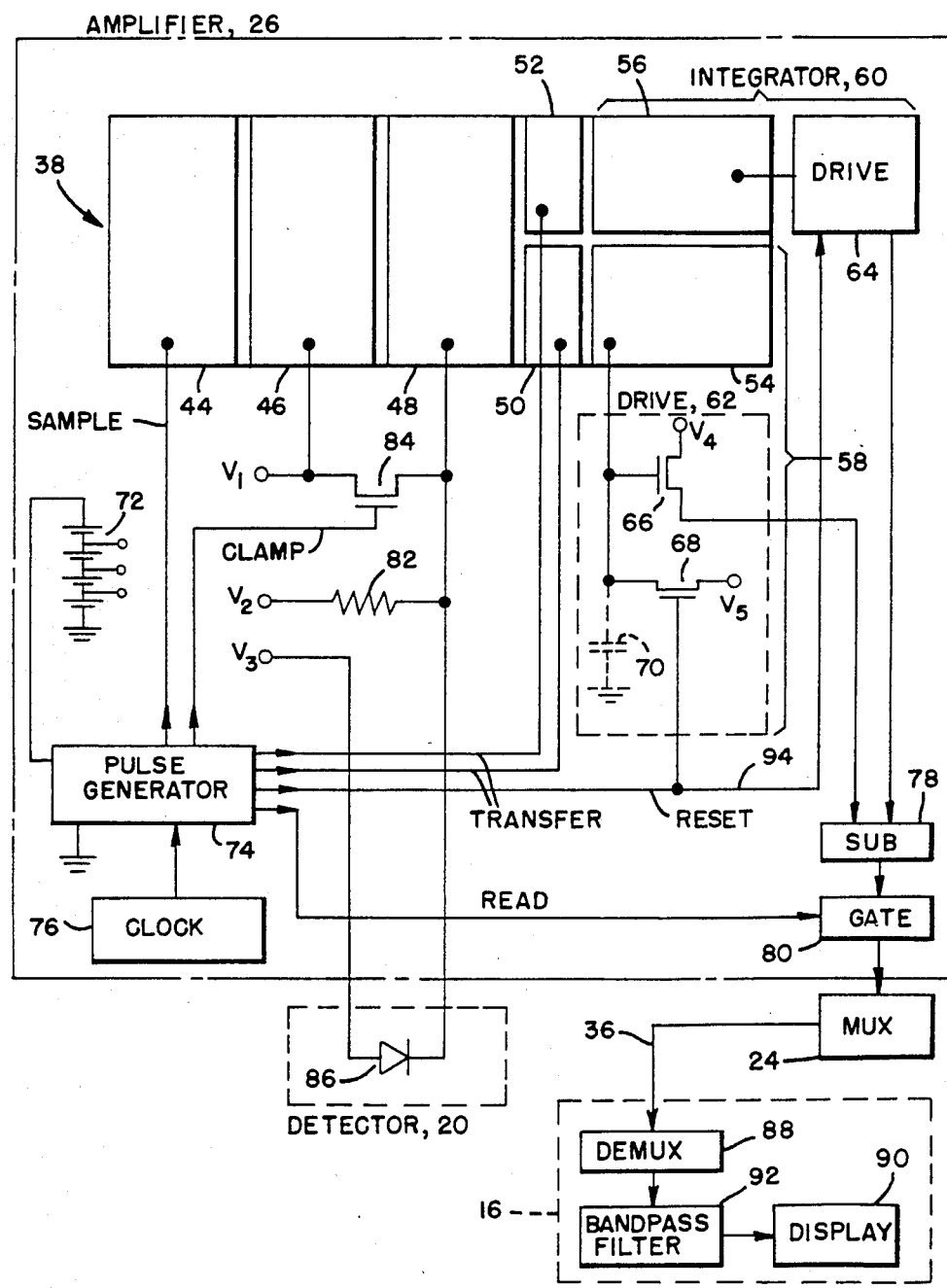
FIG. 3 shows a top plan view of the CCD of FIG. 2, and further includes an electrical schematic diagram of an amplifier of FIG. 1 coupled to the CCD.
Figure 4:
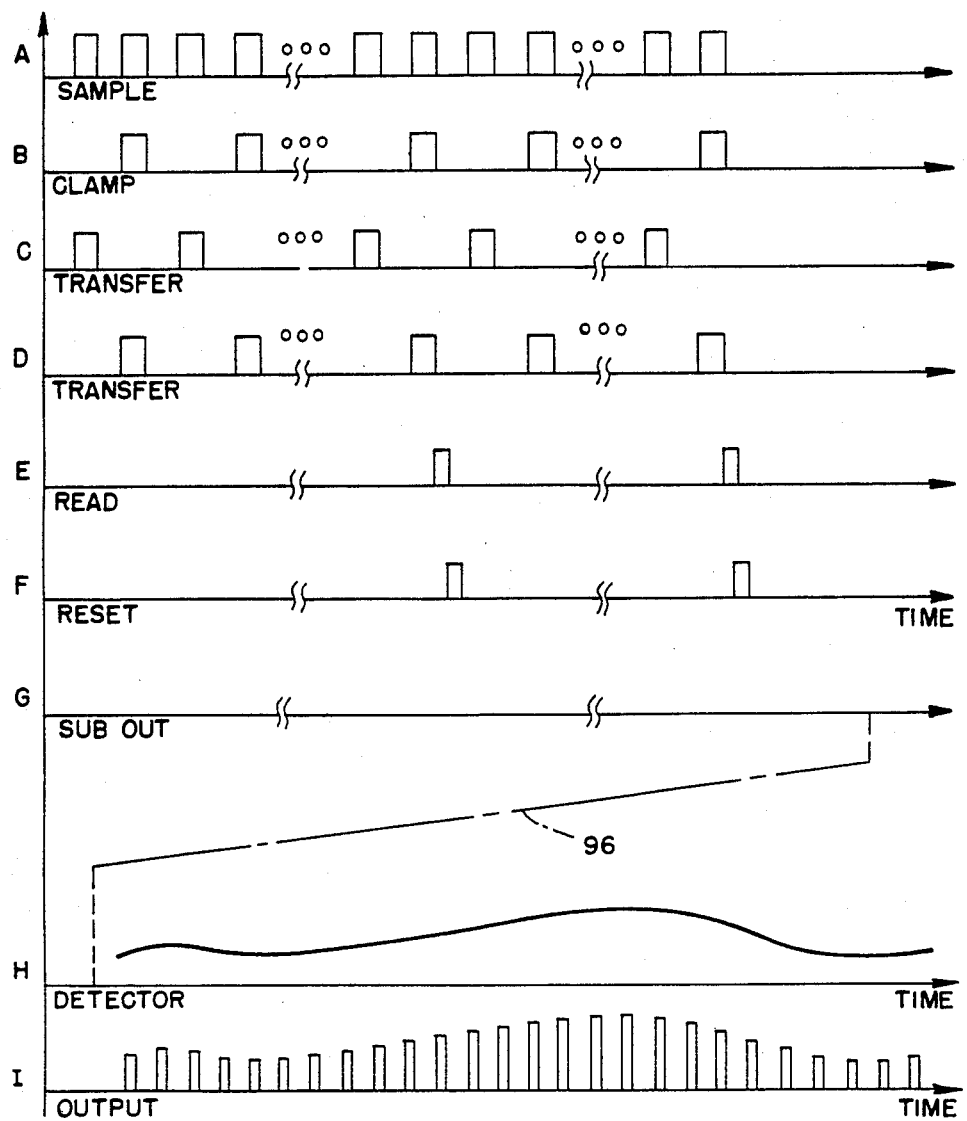
FIG. 4 is a set of timing and waveform diagrams useful in explaining the operation of the circuit of FIG. 3.

With reference also to FIGS. 2, 3, and 4, each amplifier 26 comprises a CCD structure 38 composed of an electrically conductive substrate 40 of a semiconductor material such as silicon having an N or P type dopant, an electrically insulating layer 42 of a material such as silicon dioxide, and a set of electrically conductive elements of metal or polysilicon, these elements being plates 44, 46, and 48, gate electrodes 50 and 52, and integration well electrodes 54 and 56. The portion of the structure 38 incorporating the three plates 44, 46, and 48, in cooperation with the layer 42 and the substrate 40 constitutes a charge coupled device, the remaining portions of the structure 38 including the electrodes 50, 52, 54, and 56 being additional elements for accomplishing the purposes of the invention. The operation of the entire structure 38 is in accord with the well known operation of charge-coupled devices. With respect to such operation, it is noted in particular, that the amount of charge stored in a cell, such as the region beneath the plate 46 or the plate 48, is dependent on the magnitude of a bias voltage impressed between the plate 46 or 48 and the substrate 40 of the cell of the charge-coupled device. It is further noted that a substantially larger voltage can inhibit the propagation of a charge packet from cell to cell along the structure 38.

The operation of the CCD structure 38 corresponds to the well-known operation of a charge-coupled device. A 5-volt pulse is applied to the plate 44 relative to the substrate 40 which is grounded. A charge develops in the region of the plate 44. The charge then propagates to the region of the plate 46 which is maintained at a bias voltage of approximately 2 volts. Thereafter, the charge propagates to the region of the plate 48 which has a nominal voltage of approximately 2 volts applied thereto. In the construction of the structure 38, well-known doping is applied to the region of the plate 44 by diffusion to provide a diffusion region which acts, as does a source or drain region in a field-effect transistor, to receive an activating signal such as the aforementioned 5-volt pulse.

In accordance with the invention, a succession of pulses is applied to the plate 44 to generate a succession of charge packets which occur at a rate well above the sampling rate of a signal received by a detector 20. Furthermore, in accordance with the invention, the signal produced by a detector 20 is applied to the plate 48 to modulate the voltage thereof. Such modulation alters the quantity of charge found within the region of the plate 48 from that which would be present in the event that a steady bias voltage were applied to the plate 48. In particular, an increase of voltage at the plate 48 from the nominal value of bias voltage results in an increased value of charge appearing in the region of the plate 48 with each of the foregoing charge packets. Similarly, a decrease in the plate voltage at the plate 48 results in a decrease in the magnitude of a charge presented by a charge packet. Thereby, the succession of charges induced by a pulsing of voltage at the plate 44 results in a modulated stream of charges appearing at the plate 48. The voltage increments appearing at the plate 48 due to the modulation by the detector signal is a small fraction of the bias voltage, for example less than approximately 10% to 20% of the bias voltage.

In the case of the gate electrodes 50 and 52, the voltages applied thereto are substantially larger in magnitude than the magnitude of the bias voltage applied to the plates 46 and 48. As will be explained subsequently, positive and negative voltage pulses having a magnitude of approximately 5 volts are applied alternately to the two electrodes 50 and 52. The width of the electrodes 50 and 52, as measured in the direction of propagation of the charge packets, is substantially less than that of the plate 48, so as to provide the electrodes 50 and 52 the characteristics of a gate. In the presence of the positive and negative 5-volt pulses, the electrodes 50 and 52 serve as gates for inducing and inhibiting the flow of the charge packets. Upon activation of the electrode 50 with the positive voltage pulse, the electrode 50 induces propagation of the charge packet to the region of the electrode 54. Similarly, activation of the electrode 52 with the positive voltage pulse induces propagation of the charge packet to the region of the electrode 56.

As will be explained hereinafter, the positive and negative pulses are applied to the gate electrodes 50 and 52 in synchronism with the propagation of the charge packets so as to switch these packets between the regions of the electrodes 54 and 56.

As is shown in FIG. 2, the insulating layer 42 is enlarged to have a greater depth in the region of the electrodes 54. A similar construction, not shown in the view of FIG. 2, is also provided for in the region of the electrode 56. Substantially larger voltages are applied to the electrodes 54 and 56 so as to produce a large potential well capable of storing an accumulation of charge from many of the foregoing charge packets. Such a charge storage may be represented as a capacitor, and, as will be described subsequently, provides the function of an integrator. The foregoing switching action of the gate electrodes 50 and 52 serves to store charge accumulations associated with a detected infrared signal in one of the integrators while charges associated with noise and drift are stored in the other one of the integrators.

As shown in FIG. 3, the amplifier 26 further comprises two integrators 58 and 60, the integrator 58 including the region of the electrode 54 and a drive circuit 62. The integrator 60 is formed in the same fashion, and includes the region of the electrode 56 and a drive circuit 64. Each of the drive circuits includes two field-effect transistors (F.E.T.) 66 and 68 which connect with the respective electrodes 54 and 56. The capacitor 70, shown in phantom in the circuit 62, connects between the electrode 54 and ground to represent the capacitance of the potential well between the electrode 54 and the substrate 40 (FIG. 2). Capacitance of the potential well formed between the electrode 56 and the substrate 40 may also be represented by a capacitor (not shown) in the drive circuit 64.

The amplifier 26 further comprises a source of electric power represented by a battery 72 having taps for providing various values of bias voltage, a pulse generator 74, a clock 76, a subtractor 78, a gate 80, a resistor 82, and a field-effect transistor 84, and also includes connections with the detector 20 and the multiplexer 24. The detector 20 functions electrically as a diode and, accordingly, is shown as a diode 86 in FIG. 3. Also shown in FIG. 3 is the connection via line 36 between the multiplexer 24 and the imaging unit 16, the latter being shown with components typically found in an imaging unit, namely, a demultiplexer 88, a display 90, and a set of bandpass filters 92 interconnecting the demultiplexer 88 with the display 90.

The transistor 84 is connected via its source and drain terminals between the plates 46 and 48, and has its gate terminal connected to an output terminal of the pulse generator 74. The plate 46 also connects with a terminal of the battery 72 providing a bias voltage V1. One terminal of the resistor 82 connects with the junction of the transistor 84 and the plate 48, the other terminal of the resistor 82 being connected to a terminal of the battery 72 providing a voltage V2. The diode 86 is connected between the junction of the plate 48 with the transistor 84 and a terminal of the battery applying a voltage V3. The plate 44 connects with a second output terminal of the pulse generator 74. The generator 74 is driven by clock pulses of the clock 76.

The gate electrodes 50 and 52 connect with third and fourth output terminals of the pulse generator 74. A reset line 94 connects a fifth output terminal of the pulse generator 74 with each of the drive circuits 62 and 64. A sixth output terminal of the generator 74 applies a read signal to the gate 80. Output signals of the drive circuits 62 and 64 are applied to the subtractor 78, which forms a difference between the two output signals, the difference being applied via the gate 80 to the multiplexer 24.

In operation, the pulse generator 74, and other components of the amplifier 26, receive electrical power from the battery 72. The pulse generator 74 applies a sequence of sample pulses (graph A of FIG. 4) to the plate 44. The detector 20, in response to incident infrared radiation, generates a current which flows from the diode 86 through the resistor 82 resulting in a voltage drop develops across the resistor 82. The resistor 82 serves as a load for the detector 20. The total voltage impressed upon the plate 48 is equal to the sum of the voltage V2 plus the drop across the resistor 82. With each sample pulse, a charge packet is generated and propagates along the CCD structure 38 past the plates 46 and 48 towards the integrators 58 and 60. The magnitude of the charge in a packet is dependent on the magnitude of the voltage impressed upon the plate 48 and, therefore, varies in accordance with the magnitude of infrared radiation upon the detector 20.

The pulse generator 74 applies a clamp pulse (Graph B of FIG. 4) to the gate terminal of the transistor 84 which allows current to flow between the source and drain terminals of the transistor 84, thereby providing a bypass path for current of the detector 20 and essentially clamping the voltage of the plate 48 to equal the voltage of the plate 46. As shown in FIG. 4, the train of clamp pulses is synchronized with the train of sample pulses, the clamp pulses occurring at half the pulse repetition frequency of the sample pulse train. The clamp pulse appears concurrently with alternate ones of the sample pulses. As a result, the magnitude of the charge passing the plate 48 in successive charge packets alternates between magnitudes representing drift current and incident radiation.

The generator 74 applies transfer gate pulses to the gate electrodes 50 and 52 as shown in graphs C and D of FIG. 4. The trains of transfer pulses have the same pulse repetition frequency as does the train of clamp pulses (Graph B). The transfer pulse trains are synchronized with the sample pulse train and occur during alternate ones of the sample pulses. The pulses of Graph C occur between the clamp pulses of Graph B while the transfer pulses of Graph D occur concurrently with the clamp pulses of graph B. Thereby, alternate charge packets of the sample pulses are steered by the gate electrodes 50 and 52 to the integrators 58 and 60. Since the transfer pulses of Graph C are applied to the electrode 50, the integrator 58 receives charge packets containing information of the incident radiation while the integrator 60 receives charge packets having a reference value.

The resulting charge accumulated in the capacitors 70 of each of the integrators is coupled via the transistor 66 to the subtractor 68. The output signal of the subtractor 78 is the difference of the signals of the two integrators 58 and 60. At the end of each time interval allocated for the development of a pixel signal, the generator 74 applies the read signal (graph E of FIG. 4) to the gate 80 for transferring a difference signal from the subtractor 78 to the multiplexer 24. Thereafter, as shown in graph F, the generator 74 outputs the reset signal on line 94 to drive the transistor 68 to discharge the capacitor 70 in each of the circuits 62 and 64, and thereby reset the integrators 58 and 60 for reception of a succession of pulses for the next pixel signal to be presented to the imaging unit 16.

The difference signal outputted by the subtractor 78 is shown, in stylized fashion, in graph G of FIG. 4. The signal slowly rises during a pixel interval as further charge packets are received by the integrators 58 and 60. After the signal is read out via the gate 80 to the multiplexer 24, the outputted difference signal of the subtractor 78 is reduced to zero upon a resetting of the integrators by the reset signal on line 94.

A dashed line 96 in FIG. 4 represents a change of time scale between the graphs G and H. Graph H portrays a stylized view of the output signal of the detector 20 over a scan line having many pixels. Graph I shows the signal pulses applied by the gate 80 to the multiplexer 24. The train of pulses in graph I has an envelope which follows the amplitude of the detected radiation signal on graph H. The pulse signals of a set of detectors 20 and amplifiers 26 (FIG. 1) are applied to the multiplexer 24 which reads these signals successively to output them serially along the line 36. Preferably, the clocks 76 in each of the amplifiers 26 are driven, in a well-known fashion, by synchronization pulses (not shown) developed by circuitry within the multiplexer 24 so that the pulses outputted by the gates 80 in the individual ones of the amplifiers 26 occur when the multiplexer 24 is ready to read them. Alternatively, if desired, the clocks 76 of the individual amplifiers 26 may be replaced with a common timing circuit within the multiplexer 24 which applies clock pulses for driving the generators 74 with the desired time synchronizations.

The generator 74 may be formed of a set of pulse generators (not shown) of well-known configuration for producing the pulses disclosed in graphs A-F. By way of simplification of such circuitry, a single flip-flop may produce the pulses of graph A, with logic circuitry triggering a second flip-flop for the clamp pulses in response to alternate ones of the pulses produced by the first flip-flop. Such an arrangement can be employed to produce all of the pulses in graphs A-D. The read and the reset pulses would be produced by flip-flops having a narrower pulse duration, the additional flip-flops being triggered via delay circuits from the transfer pulses of graph D. Since such circuitry is well-known, the details thereof have not been shown.

The line 36 with the multiplex signals thereon permits the signals of many detector channels to be transmitted to the imaging unit 16 via a single communication channel. In a typical scanning system, such as a system 10, a plurality of multiplexers 24 with the corresponding groups of detectors 20 would be employed for gathering imaging data of the subject 14. The multiplexers 24 and their associated detectors 20 and amplifiers 26 are of sufficiently small size to permit the fabrication of all of these components as a single monolithic structure. Such construction is facilitated by the use of multiplexed communication via the line 36. At the imaging unit 16, the pulse train signals for each of the detector channels are separated by the demultiplexer 88 and applied to individual bandpass filters of the set of filters 92. The filters have a bandwidth equal to the desired bandwidth of the signal to be presented on the display 90. Each filter serves to integrate, or smooth together, the individual pulses of the pulse train signal (graph I of FIG. 4) to present an analog signal for the display 90. It is noted that the pulse repetition frequency is substantially higher than the bandwidth of the filter in accordance with the Nyquist sampling criterion. Also, since alternate sample pulses (graph A) carry signal data, the sample rate of the pulse train (graph A) must be double the Nyquist criterion, or at least four times the signal bandwidth.

By virtue of the foregoing connection of the detector 20 to the CCD structure 38, and by virtue of the activation of the integrators 58 and 60 with charges from alternate interleaved pulse trains, the system 10 is able to produce imaging data which is substantially free of drift.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

I claim:

1. An amplifier comprising:
   a charge-coupled device formed of a semiconductor material and having an input terminal, and a controlled terminal;
   means coupled to said input terminal for pulsing said device with a sequence of pulses;
   switch means coupling an input signal to said control terminal, said switch means operating in synchronism with said pulsing means for connecting and disconnecting said input signal from said control terminal with successive ones of said pulses of said pulsing means;
   each of said pulses including a charge which propagates along said charge-coupled device from said input terminal past said control terminal, the magnitude of each such charge being dependent on the magnitude of an input signal applied to said control terminal by said switching means; alternating action of said switching means resulting in two interleaved sequences of charges wherein the charges of one of said charge sequences have a reference value, and the charges of a second of said charge sequences have a value equal to the sum of said reference value plus an increment induced by said input signal;
   first integration means;
   second integration means;
   gate means synchronized with said pulsing means for gating charges of said first and said second charge sequences respectively to said first and said second integration means, said first integration means integrating values of charge of said first sequence to provide a first integrated signal, said second integration means integrating values of charge of said second sequence to provide a second integration signal; and
   substraction means coupled between said first and said integration means for providing a difference between said first and said second integration signals, said difference having data carried by said input signal and being substantially free of drift associated with said semiconductor material of said charge-coupled device.

2. An amplifier according to claim 1 wherein each of said integration means is formed of semiconductor material disposed on a common substrate with said charge coupled device, the semiconductor structure of each of said integration means having a potential well, there being bias voltages applied to said charge-coupled device, said potential well in each of said integration means being operated at a voltage larger than said bias voltage.

3. An amplifier according to claim 2 wherein said gate means comprises a pair of gate electrodes disposed between corresponding ones of said integration means and said charge coupled device.

4. An amplifier according to claim 3 further comprising drive circuit means coupled to said first integration means and said second integration means for resetting each of said integration means after an interval of time equal to the duration of a sample of said input signal.

5. An imaging system comprising:
an array of semiconductor detectors;
means for scanning radiation from a subject across said detectors, said detectors outputting detector signals in response to said radiation;
a semiconductor charge-coupled device; means for initiating a train of charge packets propagating along said device;
means coupled to a detector of said array of detectors for modulating the magnitude of charges in a plurality of said charge packets with a detected signal;
means synchronizing said modulating means with said initiating means to modulate some of said charges while leaving the remainder of said charges at a reference magnitude;
a first and a second integration means;
means coupled to said device for steering modulated charges to said first integration means to be integrated thereby to become a first integrated signal, and for steering said remainder of charges to said second integration means to be integrated thereby to become a second integration signal;
means for subtracting one of said integrated signals from the other of said integrated signals to produce a drift-free output signal, one such output signal being produced for each of said detectors; and
means connecting with said subtracting means for combining said output signals to form an image of said subject.

6. A system according to claim 5 wherein said first and said second integration means are formed of semiconductor material on a common substrate with said charge-coupled device, part of said semiconductor material being doped to provide insulating properties for establishment of a potential well permitting a higher bias voltage than can be employed on said charge-coupled device, said potential well permitting the storage of charges in said charge packets.

7. A system according to claim 6 wherein said steering means comprises a set of electrodes disposed on said semiconductor material between said first and said second integration means and said charge-coupled device, said electrodes being individually actuable by application of voltages to direct the propagation of individual ones of said charge packets to one of said integration means while inhibiting the propagation of said charge packets to the other of said integration means.

8. A system according to claim 7 wherein said modulating means comprises a switch coupled to a detector of said array of detectors for bypassing a current generated by said detector, thereby to prevent said current from developing a modulation signal for said charge-coupled device.

9. A system according to claim 7 wherein said combining means includes a multiplexer for multiplexing signals of a plurality of detectors for forming said image.

10. A system according to claim 8 further comprising means synchronized with said modulating means for resetting said first and said second integration means after an interval of time equal to the duration of a sample of a detected signal, said sample providing a pixel in said image.

11. A system according to claim 6 further comprising means synchronized with said modulating means for resetting said first and said second integration means after an interval of time equal to the duration of a sample of a detected signal, said sample providing a pixel in said image.

12. A system according to claim 5 wherein said modulating means comprises a switch coupled to a detector of said array of detectors for bypassing a current generated by said detector, thereby to prevent said current from developing a modulation signal for said charge-coupled device.

* * * * *